(12) United States Patent
Deelman et al.

(10) Patent No.: US 7,968,435 B1
(45) Date of Patent: Jun. 28, 2011

(54) METHOD AND DEVICE FOR GROWING PSEUDOMORPHIC ALINASSB ON INAS

(75) Inventors: Peter Deelman, Calabasas, CA (US); Ken Elliott, Thousand Oaks, CA (US); David Chow, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/491,004

(22) Filed: Jun. 24, 2009

Related U.S. Application Data

(62) Division of application No. 11/447,338, filed on Jun. 5, 2006, now Pat. No. 7,598,158.

(51) Int. Cl.
*H01L 21/20* (2006.01)
(52) U.S. Cl. . 438/483; 438/478; 438/604; 257/E29.072; 257/E29.089
(58) Field of Classification Search .......... 438/483, 438/478, 604; 257/E29.072, E29.089
See application file for complete search history.

(56) References Cited

U.S. PATENT DOCUMENTS

| | | | |
|---|---|---|---|
| 5,780,867 A | 7/1998 | Fritz et al. | 257/13 |
| 6,404,791 B1 * | 6/2002 | Yang | 372/45.01 |
| 6,813,296 B2 * | 11/2004 | Goyal et al. | 372/45.01 |

OTHER PUBLICATIONS

Chow, D.H., et al., "Structural and transport properties of InAs/AlSb superlattices," *Journal of Crystal Growth*, 150 pp. 879-882 (1995).

Mathis, S.K., et al., "Lateral oxidation kinetics of AlAsSb and related alloys lattice matched to InP," *Journal of Applied Physics*, vol. 89, pp. 2458-2464 (2001).
Obane, K., "Immiscibility Analysis for III-V Quaternary Solid Solutions," *NEC Res. & Develop.*, No. 72, pp. 1-11 (1984).
Turner, G.W., et al., "MBE growth of high-power InAsSb/InAlAsSb quantum-well diode lasers emitting at 3.5µm," *Journal of Crystal Growth*, 175/176, pp. 825-832 (1998).
Washington, D., et al., "$Al_{1-x}In_xAs_{1-y}Sb_y$/GaSb heterojunctions and multilayers grown by molecular epitaxy for effective-mass superlattices," Journal of Vac. Sci. Technol., B16, pp. 1385-1388 (1998).
Wilk, A., et al., "MBE growth of InAs/InAsSb/InAlAsSb "W" quantum well laser diodes emitting near 3µm" *Journal of Crystal Growth*, 227-228, pp. 586-590 (2001).
Kudo et al. "MBE growth of Si-doped InAlAsSb layers lattice-matched with InAs", Journal of Crystal Growth 175/176; (1997), pp. 844-848.

* cited by examiner

*Primary Examiner* — Asok K Sarkar
*Assistant Examiner* — Julia Slutsker
(74) *Attorney, Agent, or Firm* — Ladas & Parry

(57) ABSTRACT

A semiconductor device and method are being disclosed. The semiconductor device discloses an InAs layer, a plurality of group III-V ternary layers supported by the InAs layer, and a plurality of group III-V quarternary layers supported by the InAs layer, wherein the group III-V ternary layers are separated from each other by a single group III-V quarternary layer. The method discloses providing an InAs layer, growing a plurality of group III-V ternary layers, and growing a plurality of group III-V quarternary layers, wherein the group III-V ternary layers are separated from each other by a single group III-V quarternary layer and are supported by the InAs layer.

12 Claims, 6 Drawing Sheets

METHOD AND DEVICE FOR GROWING PSEUDOMORPHIC ALINASSB ON INAS

CROSS-REFERENCE TO RELATED APPLICATIONS

This application is a division of U.S. patent application Ser. No. 11/447,338, filed on Jun. 5, 2006, the disclosure of which is incorporated herein by reference.

FIELD

This disclosure relates to materials that mimic the properties of an AlInAsSb quaternary and are lattice matched to InAs.

BACKGROUND AND PRIOR ART

The growth of AlInAsSb has not been extensively studied, perhaps because of the large miscibility gap predicted for these alloys. See K. Onabe, NEC Res. Dev. 72, 1(1984).

Groups at the University of Houston/University of North Texas (D. Washington, T. Hogan, P. Chow, T. Golding, C. Littler, and U. Kirschbaum, J. Vac. Sci. Technol. B16, 1385 (1998); R. Lukic-Zrnic, D. W. Stokes, C. L. Littler, and T. D. Golding, Semicond. Sci. Technol. 16, 353 (2001)) and HRL LABS (D. H. Chow, Y. H. Zhang, R. H. Miles, and H. L. Dunlap, J. Cryst. Growth 150, 879 (1995)) examined AlInAsSb lattice-matched to GaSb substrates. The Texas group controlled the quaternary composition by adjusting the Al:In and As:Sb flux ratios, while the HRL LABS group grew superlattices of the binary materials InAs and AlSb.

A group at U.C.S.B (S. K. Mathis, K. H. A. Lau, A. M Andrews, E. M. Hall, G. Almuneau, E. L. Hu, and J. S. Speck, J. Appl. Phys. 89, 2458 (2001)) examined AlInAsSb alloys lattice-matched to InP substrates. As with the Texas group, quaternary composition was controlled by adjusting the Al:In and As:Sb flux ratios.

Finally, groups at Lincoln Lab/MIT (G. W. Turner, M. J. Manfra, H. K. Choi, and M. K. Connors, J. Cryst. Growth 175/176, 825 (1997)) and Université de Montpellier II (A. Wilk, B. Fraisse, P. Christol, G. Boissier, P. Grech, M. El Gazouli, Y. Rouillard, A. N. Baranov, and A. Joullié, J. Cryst. Growth 227/228, 586 (2001)) examined AlInAsSb alloys on InAs substrates. Both of these groups also controlled the quaternary composition by adjusting the Al:In and As:Sb flux ratios. The Lincoln Lab/MIT group grew a tensile-strained alloy, while the Montpellier group studied a lattice-matched alloy, but both groups incorporated relatively small Al mole fractions (15% and 12%, respectively).

Rather than grow the AlInAsSb quaternary directly, as most groups have done, or as a digital binary superlattice, a technique of growing a ternary/quaternary superlattice is disclosed presently. The overall composition may be controlled by adjusting the As:Sb flux ratio and by modulating the Sb beam.

The disclosed technique may allow access to a wider range of quaternary compositions than may be possible with a digital binary superlattice.

The disclosed technique may further be applicable to manufacturing electronic and optoelectronic devices such as, for example, InAs-channel HEMTs, InAs HBTs, and laser diodes which may require semiconductor materials that are lattice-matched to InAs.

The growth of alloys according to the disclosed technique may also impose an artificial, short-period order, which may frustrate the tendency of the film to dissociate into more stable components.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

A technique for growing pseudo-random AlInAsSb quaternary alloys lattice-matched to InAs is disclosed presently. The disclosed technique implements short-period Group III-V materials in a superlattice to mimic the properties of random AlInAsSb quaternaries, wherein Group III-V superlattice may contain ternary/quaternary materials such as AlInAs/AlInAsSb.

Figure 1:
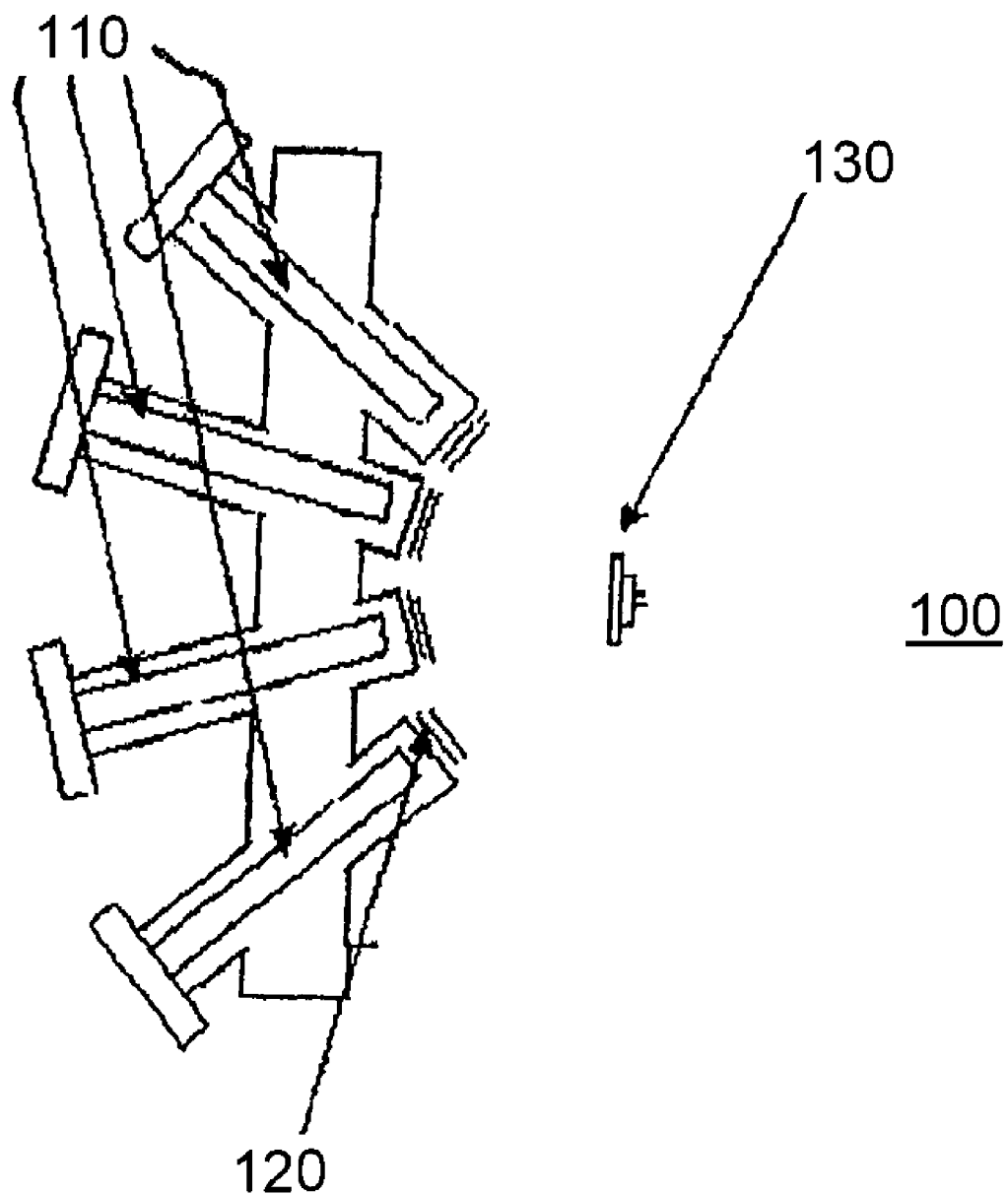
FIG. 1 depicts an exemplary molecular beam epitaxy device.

Referring to FIG. 1, a molecular beam epitaxy device 100 may, for example, be used to form the Group III-V superlattice on an InAs substrate 130. For clarity a simplified version of molecular beam epitaxy device 100 is shown in FIG. 1. Molecular beam epitaxy devices are well known in the art and the type of device that could be utilized to implement the disclosed method and system is not limited to the particular device disclosed herein. Molecular beam epitaxy device 100 may contain material sources 110 for emitting materials to be deposited on the InAs substrate 130. Each of the material sources 110 may, for example, contain either Al, In, As, or Sb materials. Each material source 110 may be opened and closed by using a shutter 120 associated with each material source 110. Layers of material may be formed on the InAs substrate 130 by emitting material from one or more of the material sources 110. The thickness of each layer may be determined by the amount of time the shutter 120 for each material source 110 may be open. The composition of each layer may be determined by the combination of shutters 120 that are opened at the same time.

Molecular beam epitaxy device 100 may be used to grow a ternary/quaternary superlattice out of, for example, AlInAs/AlInAsSb materials, that may not be lattice matched to the InAs substrate 130. The overall composition of the AlInAs/AlInAsSb superlattice, which may mimic an AlInAsSb quaternary material, may be controlled by varying the ratio of the thicknesses of the constituent layers and the As:Sb flux ratio. In practice, the thicknesses of each layer within the AlInAs/AlInAsSb superlattice and the As:Sb flux ratio may be controlled by varying the fraction of time the shutter 120, that is associated with material sources 110 containing Sb material, may be open and by varying the temperature of the material sources 110 containing Sb material.

Figure 2:
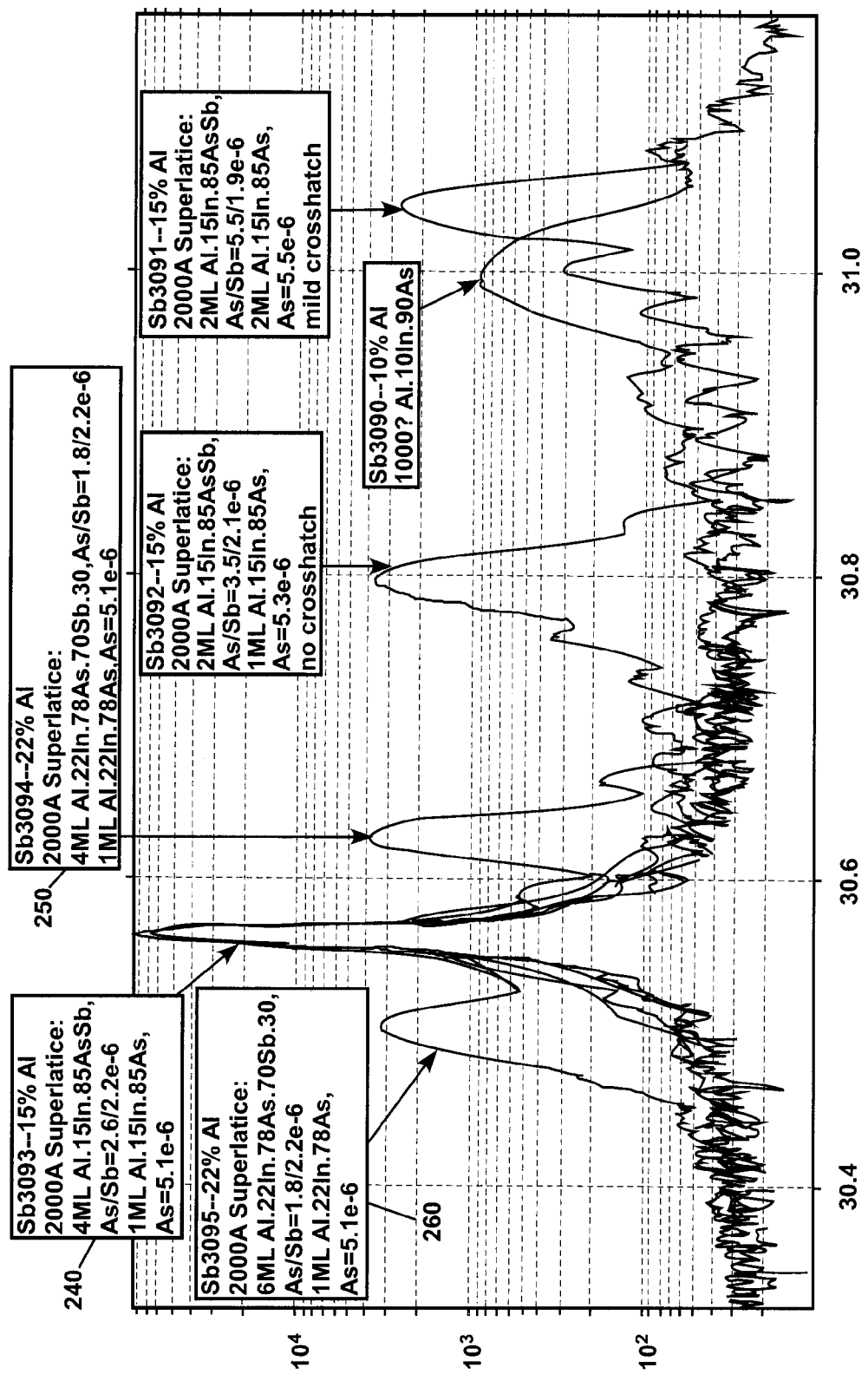
FIG. 2 depicts a summary of x-ray diffraction data according to the present disclosure.

Group III-V superlattice formed on the InAs substrate 130 may be characterized in situ using reflection high-energy electron diffraction or ex situ using x-ray diffraction and optical inspection. FIG. 2 depicts a summary of the x-ray diffraction data for exemplary Group III-V superlattices 240, 250, 260 that may be formed wherein each of the superlattices 240, 250, 260 represents a different growth. As represented in FIG. 2, the superlattice 250 is under tensile strain, the superlattice 260 is under a compression strain and the superlattice 240 is lattice matched to the InAs substrate 130. Referring to FIG. 2, the x-axis represents units of degrees θ and the y-axis represents the x-ray intensity.

Referring to FIG. 2, based on the x-ray diffraction data, the exemplary superlattice 240, containing Al mole fraction of 15%, appears to be lattice matched to the InAs substrate 130, whereas the lattice parameters of the exemplary superlattices 250, 260, containing Al mole fraction of 22%, do not appear to be lattice matched to the InAs substrate 130. Increasing the mole fraction of Al may increase a bandgap of a structure which may be desirable for electronic and optoelectronic devices. So, in order to achieve a lattice match between a superlattice containing Al mole fraction of 22% and InAs substrate 130, an appropriate time may be chosen that the shutter 120 associated with material sources 110 containing Sb material, may be open.

Figure 3A:
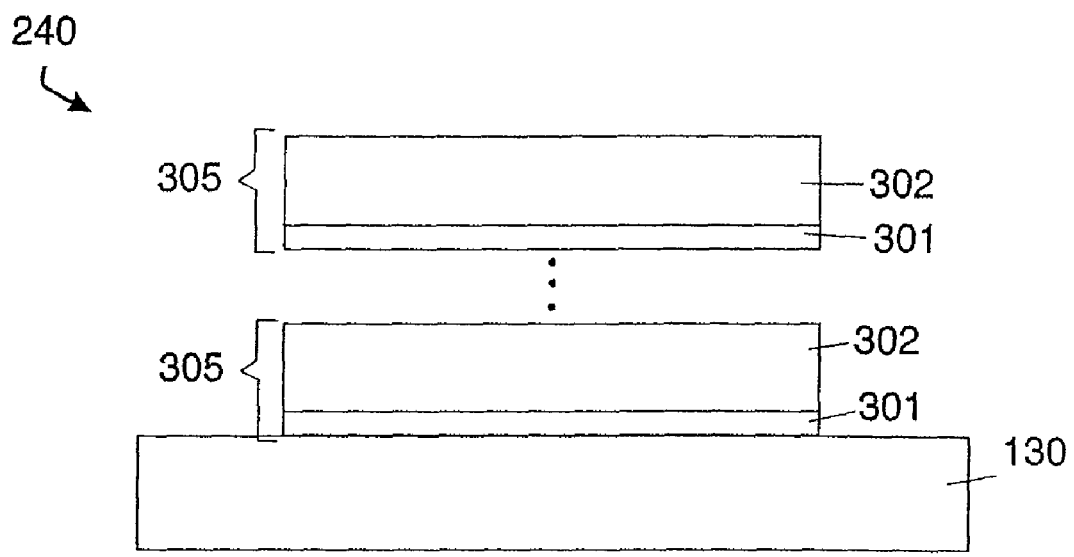
FIGS. 3A-3B depict an exemplary superlattice 240 as shown in FIG. 2.
Figure 3B:
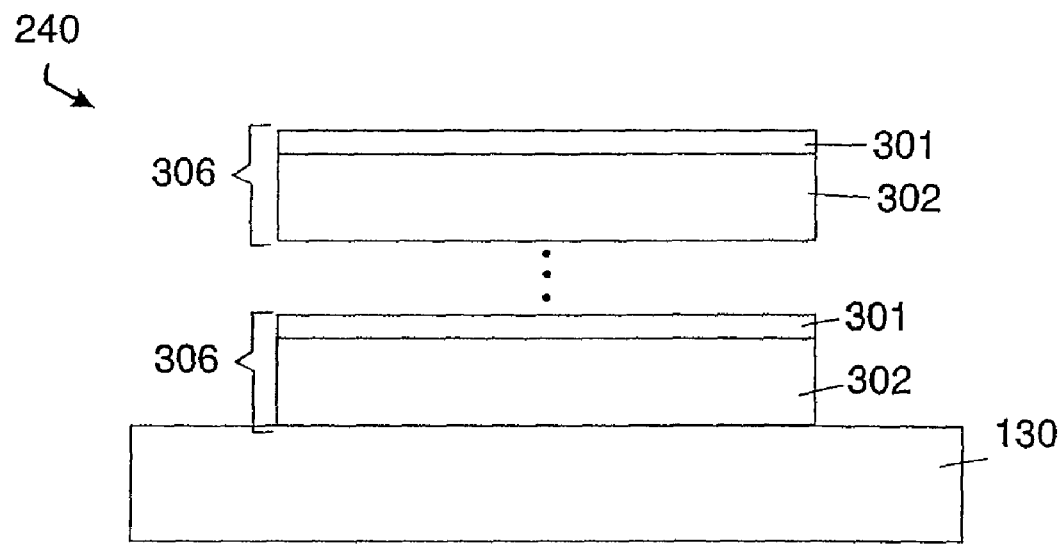

Referring to FIGS. 2, 3A and 3B, an exemplary superlattice 240, composed of ternary/quaternary materials such as $Al_{0.15}In_{0.85}AsSb/Al_{0.15}In_{0.85}As$, may be formed to be lattice matched to the InAs substrate 130.

Referring to FIG. 3A, in one exemplary embodiment, an initial ternary monolayer 301 of AlInAs material may be formed on the InAs substrate 130 followed by formation of a quaternary layer 302 of AlInAsSb material. In this exemplary embodiment, one sub-superlattice 305 may be composed of one quaternary layer 302 of about 12 Angstroms in thickness and one ternary monolayer 301 of about 3 Angstroms in thickness. The process of forming sub-superlattices 305 may be repeated until the superlattice 240 is formed.

Referring to FIG. 3B, in another exemplary embodiment, a quaternary layers 302 of AlInAsSb material may be formed on the InAs substrate 130 followed by formation of a ternary monolayer 301 of AlInAs material. In this exemplary embodiment, one sub-superlattice 306 may be composed of one quaternary layers 302 of about 12 Angstroms in thickness and one ternary monolayer 301 of about 3 Angstroms in thickness. As above, the process of forming sub-superlattices 306 once again may be repeated until the superlattice 240 may be formed.

Figure 4A:
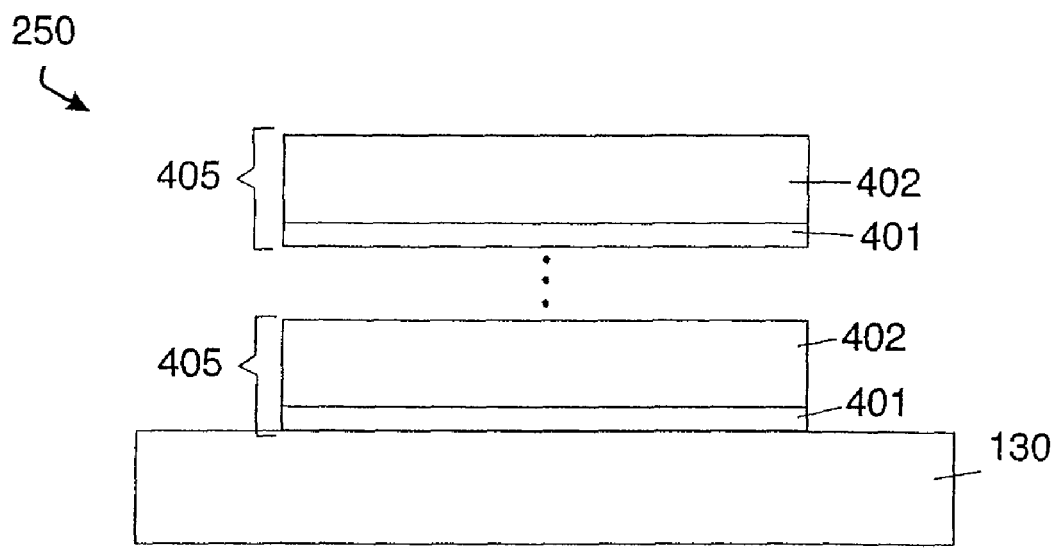
FIGS. 4A-4B depict exemplary superlattice 250 as shown in FIG. 2.
Figure 4B:
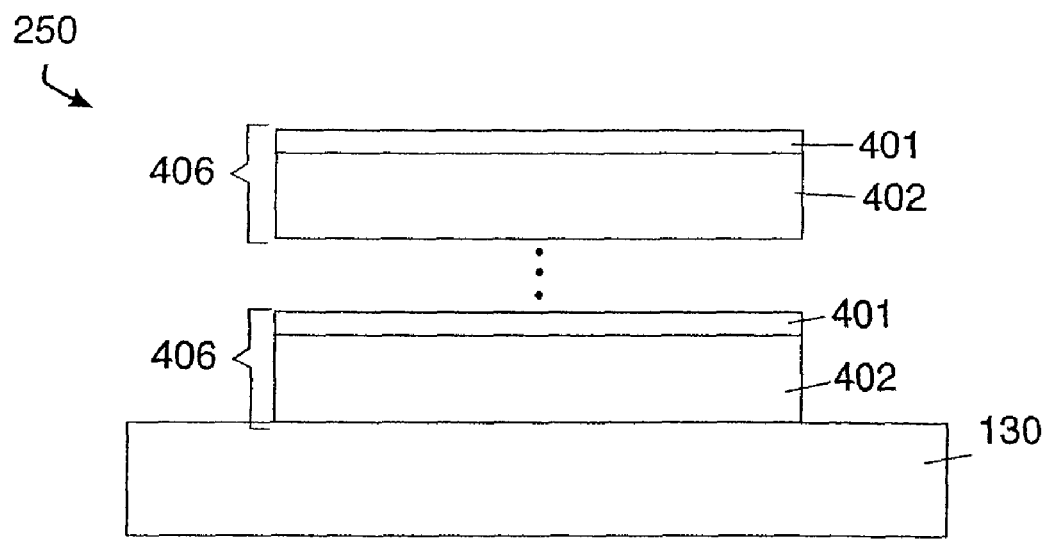

Referring to FIGS. 2, 4A and 4B, an exemplary superlattice 250, composed of ternary/quaternary materials such as $Al_{0.22}In_{0.78}AsSb/Al_{0.22}In_{0.78}As$, may be formed to be coherently strained (no dislocations) on the InAs substrate 130.

Referring to FIG. 4A, in one exemplary embodiment, an initial ternary monolayer 401 of AlInAs material may be formed on the InAs substrate 130 followed by formation of a quaternary layers 402 of AlInAsSb material. In this exemplary embodiment, one sub-superlattice 405 may be composed of one quaternary layer 402 of about 12 Angstroms in thickness and one ternary monolayer 401 of about 3 Angstroms in thickness. The process of forming sub-superlattices 405 may be repeated until the superlattice 250 is formed.

Referring to FIG. 4B, in another exemplary embodiment, a quaternary layer 402 of AlInAsSb material may be formed on the InAs substrate 130 followed by formation of a ternary monolayer 401 of AlInAs material. In this exemplary embodiment, one sub-superlattice 406 may be composed of one quaternary layer 402 of about 12 Angstroms in thickness and one ternary monolayer 401 of about 3 Angstroms in thickness. As above, the process of forming sub-superlattices 406 once again may be repeated until the superlattice 250 is formed.

Figure 5A:
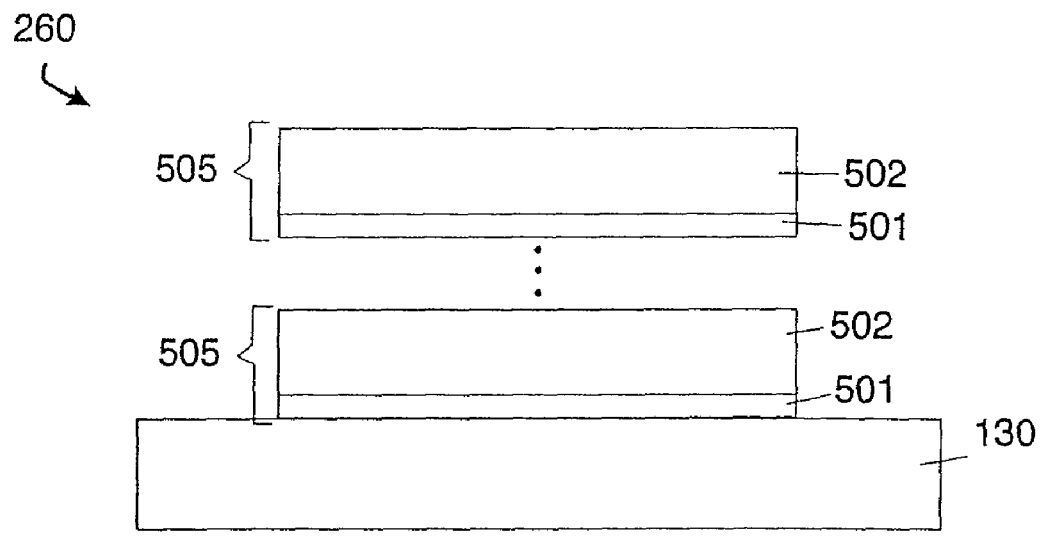
FIGS. 5A-5B depict exemplary superlattice 260 as shown in FIG. 2.
Figure 5B:
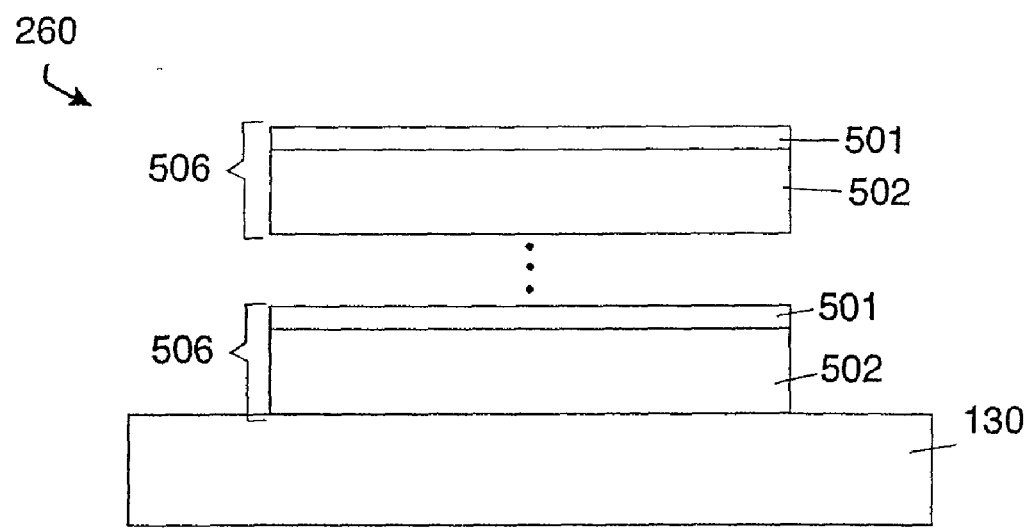

Referring to FIGS. 2, 5A and 5B, an exemplary superlattice 260, composed of ternary/quaternary materials such as $Al_{0.22}In_{0.78}AsSb/Al_{0.22}In_{0.78}As$, may be formed to be coherently strained (no dislocations) on the InAs substrate 130.

Referring to FIG. 5A, in one exemplary embodiment, an initial ternary monolayer 501 of AlInAs material may be formed on the InAs substrate 130 followed by formation of a quaternary layer 502 of AlInAsSb material. In this exemplary embodiment, one sub-superlattice 505 may be composed of one quaternary layer 502 of about 18 Angstroms in thickness and one ternary monolayer 501 of about 3 Angstroms in thickness. The process of forming sub-superlattices 505 may be repeated until the superlattice 260 is formed.

Referring to FIG. 5B, in another exemplary embodiment, a quaternary layer 502 of AlInAsSb material may be formed on the InAs substrate 130 followed by formation of a ternary monolayer 501 of AlInAs material. In this exemplary embodiment, one sub-superlattice 506 may be composed of one quaternary layer 502 of about 18 Angstroms in thickness and one ternary monolayer 501 of about 3 Angstroms in thickness. As above, the process of forming sub-superlattices 506 once again may be repeated until the superlattice 260 is formed.

Figure 6A:
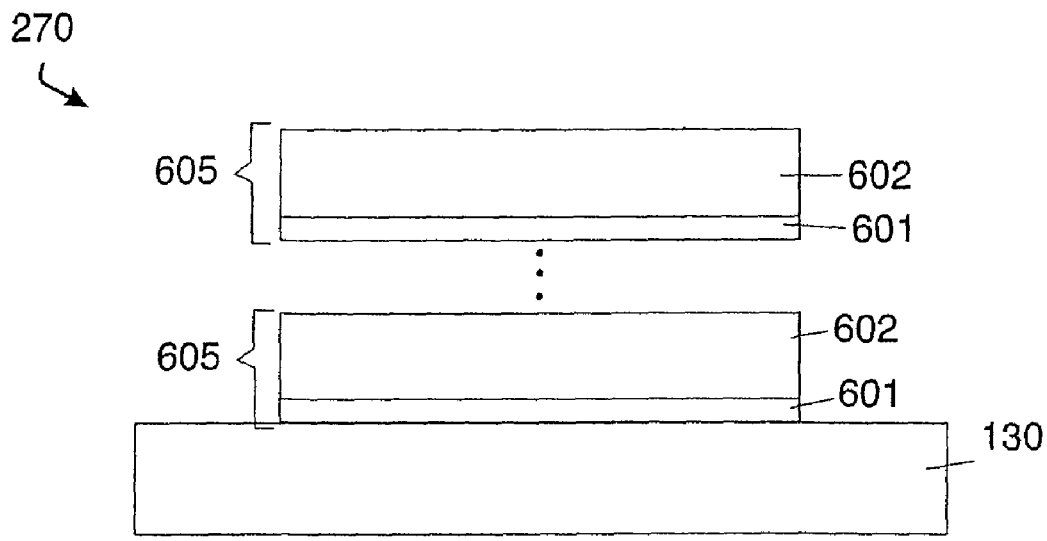
FIGS. 6A-6B depict another exemplary superlattice.
Figure 6B:
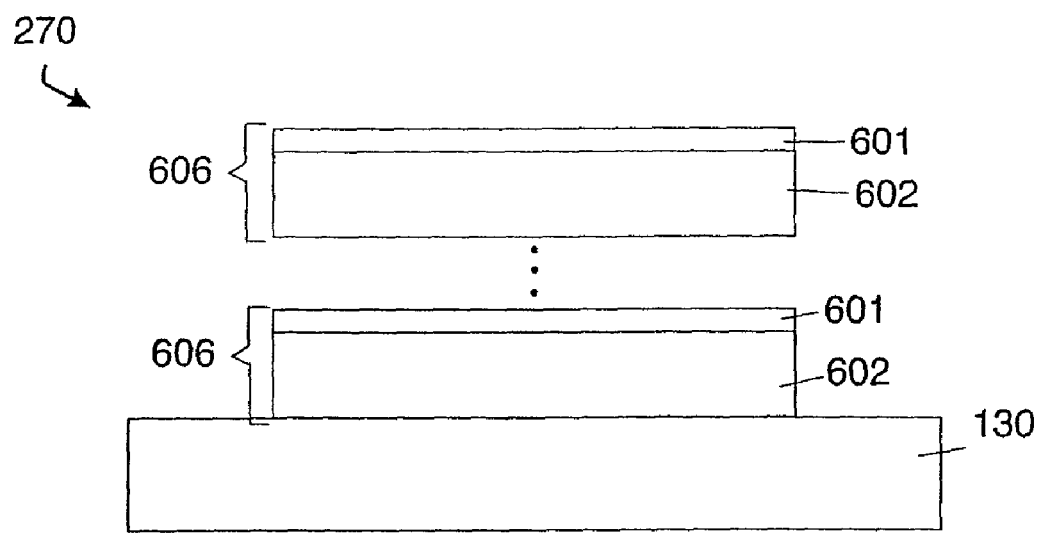

Referring to FIGS. 6A and 6B, an exemplary superlattice 270, composed of ternary/quaternary materials such as $Al_{0.22}In_{0.78}AsSb/Al_{0.22}In_{0.78}As$, may be formed to be lattice matched to the InAs substrate 130. Wherein mole fraction of Al may be about 22%. Once again, increasing the mole fraction of Al increases a bandgap of the exemplary superlattice 270 which may be desirable for electronic and optoelectronic devices.

Referring to FIG. 6A, in one exemplary embodiment, an initial ternary monolayer 601 of AlInAs material may be formed on the InAs substrate 130 followed by formation of a quaternary layer 602 of AlInAsSb material. In this exemplary embodiment, one sub-superlattice 605 may be composed of one quaternary layer 602 of about 15 Angstroms in thickness and one ternary monolayer 601 of about 3 Angstroms in thickness. The process of forming sub-superlattices 605 may be repeated until the superlattice 270 is formed.

Referring to FIG. 6B, in another exemplary embodiment, a quaternary layer 602 of AlInAsSb material may be formed on the InAs substrate 130 followed by formation of a ternary monolayer 601 of AlInAs material. In this exemplary embodiment, one sub-superlattice 606 may be composed of one quaternary layer 602 of about 15 Angstroms in thickness and one ternary monolayer 601 of about 3 Angstroms in thickness. As above, the process of forming sub-superlattices 606 once again may be repeated until the superlattice 270 is formed.

The above disclosed techniques may be applicable to manufacturing electronic and optoelectronic devices such as, for example, InAs-channel HEMTs, InAs HBTs, and laser diodes which may require semiconductor materials that are lattice-matched to InAs. As known in the art, the defining characteristic of a semiconductor is the existence of a forbidden energy gap between the top of the valence band and the bottom of the conduction band. This energy gap is called a bandgap. Many electronic devices take advantage of the favorable electronic properties that result when a material with a relatively large bandgap (a.k.a. wide bandgap) is brought into contact with a material with a relatively small bandgap (a.k.a. narrow bandgap). This may be achieved, for example, by growing the wide bandgap material on top of the narrow bandgap material, or vice versa, by molecular beam epitaxy or by some other material growth technique. Relevant devices include:

1. Heterojunction bipolar transistors (HBTs), in which the emitter layer (or the collector layer) has a bandgap wider than that of the base layer.
2. High electron mobility transistors (HEMTs), in which the Schottky layer has a bandgap wider than that of the channel layer.
3. Semiconductor lasers, in which the inactive confinement or cladding layers have a bandgap wider than that of the active layer.

According to the present disclosure, AlInAsSb alloys disclosed above have lattice parameters equal to that of InAs material and have bandgaps that are greater than that of InAs material. Thus, the present disclosure enables the construction of, for example:

1. HBTs with AlInAsSb emitter layers (and also collector layers) and InAs base layers.
2. HEMTs with AlInAsSb Schottky layers and InAs channel layers.
3. Semiconductor lasers with AlInAsSb confinement and cladding layers and InAs active layers.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for," and no method or process step herein is to be construed under those provisions unless the step, or steps, are expressly recited using the phrase "step(s) for . . . ."

What is claimed is:

1. A method of producing a material that mimics the properties of an AlInAsSb quaternary material and is lattice matched to InAs material, the method comprising:
   providing an InAs layer;
   growing a plurality of group III-V ternary layers, each ternary layer having two group III elements and one group V element; and
   growing a plurality of group III-V quaternary layers, each quaternary layer having two group III elements and two group V elements;
   wherein the group III-V ternary layers are separated from each other by a single group III-V quaternary layer;
   wherein each group III-V ternary layer is in direct contact with a group III-V quaternary layer; and
   wherein at least one group III-V ternary layer is grown in direct contact with the InAs layer.

2. The method of claim 1, wherein each group III-V ternary layer comprises a AlInAs material and each group III-V quaternary layer comprises a AlInAsSb material.

3. The method of claim 1, wherein the group III-V ternary layers and the group III-V quaternary layers are grown using molecular beam epitaxy.

4. The method of claim 1, wherein each group III-V ternary layer is about 3 Angstroms thick.

5. The method of claim 1, wherein each group III-V quaternary layer is about 12 Angstroms to 18 Angstroms thick.

6. The method of claim 1 wherein a superlattice comprised of the plurality of group III-V ternary layers and the plurality of group III-V quaternary layers is lattice matched to the InAs layer.

7. The method of claim 6 wherein the superlattice has a Al mole fraction of 15%.

8. The method of claim 1 wherein a superlattice comprised of the plurality of group III-V ternary layers and the plurality of group III-V quaternary layers is under tensile strain to the InAs layer.

9. The method of claim 8 wherein the superlattice has a Al mole fraction of 22%.

10. The method of claim 1 wherein a superlattice comprised of the plurality of group III-V ternary layers and the plurality of group III-V quaternary layers is under compressive stain to the InAs layer.

11. The method of claim 10 wherein the superlattice has a Al mole fraction of 22%.

12. The method of claim 1 wherein a superlattice comprised of the plurality of group III-V ternary layers and the plurality of group III-V quaternary layers is coherently strained on the InAs layer.

* * * * *